United States Patent [19]

Ham

[11] Patent Number: 5,654,211

[45] Date of Patent: Aug. 5, 1997

[54] METHOD FOR MANUFACTURING ULTRA-HIGH SPEED BIPOLAR TRANSISTOR

[75] Inventor: Seog Heon Ham, Seoul, Rep. of Korea

[73] Assignee: Samsung Electronics Co., Ltd., Suwon, Rep. of Korea

[21] Appl. No.: 664,823

[22] Filed: Jun. 17, 1996

[30] Foreign Application Priority Data

Jun. 15, 1995 [KR] Rep. of Korea ............ 95-15889

[51] Int. Cl.$^6$ .................................... H01L 21/265
[52] U.S. Cl. .................. 438/367; 257/588; 257/592; 438/371
[58] Field of Search ................ 437/31, 193, 195, 437/152, 162; 148/DIG. 11; 257/588, 592

[56] References Cited

U.S. PATENT DOCUMENTS

| | | | |
|---|---|---|---|
| 5,024,957 | 6/1991 | Harame et al. | 437/31 |
| 5,501,992 | 3/1996 | Nakamura | 437/31 |
| 5,541,124 | 7/1996 | Miwa et al. | 437/31 |

FOREIGN PATENT DOCUMENTS

| | | | |
|---|---|---|---|
| 0238058 | 9/1989 | Japan | 437/31 |

*Primary Examiner*—John Niebling
*Assistant Examiner*—Long Pham
*Attorney, Agent, or Firm*—Cushman Darby & Cushman, IP Group of Pillsbury Maidson & Sutro LLP

[57] ABSTRACT

A method of producing the bipolar transistor includes forming an aperture through a triple layer over an active region of an epitaxial layer, then forming a shallow polysilicon film at the bottom of the aperture. An intrinsic base region is formed by segregating a conductive impurity to the epitaxial layer by thermally oxidizing the polysilicon film. Then an extrinsic base region is formed by diffusing impurities into the epitaxial layer from a polysilicon sidewall formed on the aperture. In the transistor fabricated according to this method, an insulation layer of oxide silicon or nitrogen silicon is formed under the base polysilicon layer. Accordingly, impurities from the base polysilicon layer do not diffuse into the epitaxial layer during the diffusion process. Instead, the extrinsic base region is formed by the diffusion of impurities from the polysilicon sidewall which is connected to the base polysilicon layer. Therefore the length of the entire base region is shortened. Furthermore, by forming the intrinsic base region by thermally oxidizing the shallow polysilicon film, the base width and the transmission time are reduced, thus leading to a higher performance speed of the element.

7 Claims, 7 Drawing Sheets

METHOD FOR MANUFACTURING ULTRA-HIGH SPEED BIPOLAR TRANSISTOR

BACKGROUND OF THE INVENTION

1. Field of the Invention

The present invention relates in general to a method for providing an ultrahigh speed bipolar transistor, and more particularly, to an improved method for providing an ultrahigh speed bipolar transistor having a double-layered sidewall composed of polysilicon and an insulating material.

2. Description of the Related Art

In general, ultrahigh speed bipolar transistors are employed in various applications requiring operating frequencies in the range of 10–45 GHz. A typical bipolar transistor is described below with reference to the figures appended.

FIG. 1 is a schematic cross-sectional view of a typical bipolar transistor. An N type epitaxial layer 120 which functions as the collector region is formed on a P⁻ substrate 100, and a buried layer 110 is disposed between the epitaxial layer 120 and the substrate 100. A base region 130 is formed on the epitaxial layer 120, on which an N⁺ emitter region 140 is slightly formed. On the buried layer 110, an N⁺ collector sink region 121 is formed in the epitaxial layer 120. The sink region is isolated from the base region 130 by a field oxide film 167 and is electrically connected to a collector electrode 123 through a collector polysilicon layer 122 formed of an N⁺ polysilicon. The base region 130 is electrically connected to a base electrode 133 through a base polysilicon layer 131 formed of a P⁺ polysilicon, and the emitter region 140 is electrically connected to the emitter electrode 142 through an emitter polysilicon layer 141 formed of an N⁺ polysilicon.

The three electrodes 123, 133 and 142 are electrically isolated from one another by oxide films 162 and 164, while the base polysilicon layer 131 is isolated from the emitter polysilicon layer 141 by an oxide film 161 formed on the base polysilicon layer 131, and by an oxide sidewall 151 formed at a side edge of the base polysilicon layer 131 and a side edge of the oxide film 161. On the partial base region 130, P⁺ base polysilicon layers 131 and 132 are formed, and are isolated from the emitter polysilicon layer 141 and the collector polysilicon layer 122 by an oxide sidewall 152 and the oxide film 163 formed on the base polysilicon layer 132.

In this bipolar transistor, an operating speed is determined by such values as a maximum oscillation frequency, an emitter coupled logic (ECL) circuit transmission delay, a maximum cut-off frequency, and a base transmission time. These parameters are described in detail below, with reference to FIG. 3, which is a circuit diagram of a common emitter bipolar transistor, and FIG. 4, which is a small signal equivalent circuit diagram including a load resistance.

(A) The Maximum Oscillation Frequency

This is a frequency at which maximum power gain can be obtained in a wide band analog amplifier and a non-saturated logic gate circuit, as well as in small and large signal amplifiers.

In FIGS. 3 and 4, $C_{jc}$ is a collector-base junction capacitance, $C_{je}$ is an emitter-base junction capacitance, $C_{dif}=C_{bb}$ is a diffusion capacitance, and $g_m$ is a ratio of an output current to an input voltage. If $C_\pi=C_{je}+C_{bb}$, the output resistance $r_{out}$ is defined as follows:

$$r_{out}=C_\pi/C_{jc}\,g_m \quad \text{(Eq. 1)}$$

From this equation, since the contribution of $C_\pi$ to the input impedance is very small compared with $r_{bb}$ in high frequency operations, a high frequency power gain $G_p$ can be derived as follows:

$$G_p=i_c^2R_L/i_b^2r_{bb}=g_m^2R_L/4r_{bb}\omega^2C_\pi^2 \quad \text{(Eq. 2)}$$

As can be seen from Eq. 2, when the load resistance $R_L$ is equal to the output resistance $r_{out}$, a maximum power gain $G_{p\,max}$ is obtained. At this time, the maximum power gain $G_{p\,max}$ is expressed as follows:

$$G_{p\,max}=g_m/4r_{bb}\omega^2C_\pi C_{jc} \quad \text{(Eq. 3)}$$

In Eq. 3, if $g_m/2\,\pi C_\pi$ is replaced with a maximum cut-off frequency $f_t$, and $\omega$ with $2\,\pi f$, a maximum oscillation frequency $f_{osc\,max}$ can be derived as follows:

$$f_{osc\,max}=\sqrt{f_t/8\pi C_{jc}r_{bb}} \quad \text{(Eq. 4)}$$

From the above, it is clear that the collector-base junction capacitance $C_{jc}$ must be reduced and the cut-off frequency $f_t$ must be increased in order to obtain the maximum oscillation frequency which yields the maximum power gain.

(B) ECL Transmission Delay

The equation governing an ECL transmission delay is given as follows:

$$t_{pd}=Ar_{bb}C_{jc}+Br_{bb}C_{je}+CC_{jc}(R_L+R_e)+Dr_eC_{je}+EC_{sb}(R_L+r_e)+FC_L(R_L+r_e) \quad \text{(Eq. 5)}$$

where A, B, C, D, E and F are proportional constants, $C_{sb}$ is the collector-substrate junction capacitance, $C_L$ is the interconnection capacitance. The basic assumption made here is that the collector-base junction capacitance must be reduced in order to reduce the ECL transmission delay, since the $CC_{jc}(R_L+R_e)$ term is the most important delay component in the right side of Eq. 5.

(C) Maximum Cut-off Frequency

This is one of the most important parameters in estimating the high frequency characteristics of elements.

The small signal current gain of equivalent circuit shown in FIG. 4 can be expressed as follows:

$$h_{fe}(\omega)=i_c/i_b=g_mV_{be}/i_b \quad \text{(Eq. 6)}$$

where $V_{be}/i_b$ is the input impedance. If this term is replaced with $g_\pi$, then it follows that:

$$g_\pi=dI_b/dV_{BE}=g_m/h_{fe} \quad \text{(Eq. 7)}$$

Further, if $C_\pi=C_{je}+C_{je}+C_{bb}$, from Eqs. 6 and 7, the small signal current gain is obtained as follows:

$$h_{fe}(\omega)\;=g_m/g_\pi(1+j\omega C_\pi g_\pi) \quad \text{(Eq. 8)}$$
$$\;\;\;\;\;\;\;\;\;=h_{fe}(0)/[1+j\omega h_{fe}(0)c_\pi g_m]$$

From Eq. 8, if deriving the cut-off frequency when $h_{fe}=1$, it follows that:

$$f_t=g_m/2\,\pi C_\pi \quad \text{(Eq. 9)}$$

If the cut-off frequency $f_t$ is the reciprocal of a total delay time during the operation of the common emitter circuit including the element, then a higher $f_t$ can be obtained from the following equation derived from Eq. 9.

$$1/2\pi f_t=C_\pi/g_m=\frac{V_t}{I_c}(C_{je}+C_{jc})+t_{bb} \quad \text{(Eq. 10)}$$

where $C_\pi/g_m$ is a time constant which depends upon the emitter-base junction capacitance and the collector-base junction capacitance, and $[V_t(C_{je}+C_{jc})/I_c]+t_{bb}$ is the transit time of the minority carrier passing through the base region. Therefore, in order to increase $f_T$, the junction capacitance and the transmission time of the carrier in the base region should be reduced.

(D) Base Transit Time

As mentioned above, the parameters which define the cut-off frequency include the transit time of the minute carrier, the collector-base junction capacitance and the emitter-base junction capacitance. Among these, the most important parameter is the transit time $t_{bb}$ of the minority carrier passing through the base region, because this is the main source of delay. That is, the collector-base junction capacitance $C_{jc}$ and the emitter-base junction capacitance $C_{je}$ are not the principal contributors in the component for determining the maximum cut-off frequency, in comparison with $t_{bb}$, when $C_{jc}$ and $C_{je}$ are large.

In an NPN transistor, the base transit time is approximately as follows:

$$t_{bb}=W_b^2/\eta D_n \qquad \text{(Eq. 11)}$$

where $W_b$ represents base width, $\eta$ is the function of a base concentration profile and $D_n$ is an electron diffusion coefficient.

When the slope has a sharp slant (highly non-uniform impurity concentration), an accelerated electric field is dynamically generated in the entire base region and $\eta$ is more than 2, the base transit time is much more decreased.

As mentioned above, the collector-base junction capacitance and the base width should be small, so that the bipolar transistor can be operated at higher speeds. To obtain these structures, using self-aligned approach employing a double-polysilicon process, the base region is formed by self-aligning from the P$^+$ base polysilicon layer, and the base contact window is formed.

With reference to FIGS. 2A to 2E, the fabrication method of the bipolar transistor illustrated in FIG. 1 is described below, with particular emphasis on the collector-base junction capacitance.

As shown in FIG. 2A, an N$^+$ buried layer 110 is formed on a P$^-$ substrate 100 using a first mask, and then an N type epitaxial layer 120, which functions as a collector region, is formed on the N$^+$ buried layer 110. An isolation region (not shown) is then formed to isolate each element, using a second mask, and an N$^+$ collector sink region 121 is also formed on the buried layer 110 using a third mask. A fourth mask is then used to define a first region 200 and a second region 300, and a LOCOS isolation process is used to form field oxide films 166, 167 and 168 at each end of the first and second regions 200 and 300. Successively, a fifth mask is used to expose a polysilicon region at which the deposition of the P$^+$ polysilicon should be performed.

As shown in FIG. 2B, this is followed by depositing the P$^+$ polysilicon and patterning the deposited layer using a sixth mask. The fabricated polysilicon layer 170 thus covers the first region 200 of the epitaxial layer, but not the second region 300.

Insulating material is then deposited and patterned on the polysilicon layer 170 using a seventh mask. The resulting combined layers are then opened, so that the base polysilicon layers 131 and 132, as well as the insulating layer 160, with an aperture 400 formed therebetween, are formed. After this, a thermal-oxidation process is executed to form the oxide film 500 on the bottom of the aperture 400, and a P type impurity such as BF$_2$ is implanted using an eighth mask, as shown in FIG. 2C.

Deposition of SiO$_2$ and reactive ion etching (RIE) with respect to the oxide silicon layer are successively performed, so that oxide sidewalls 151 and 152 are formed, which respectively cover the base polysilicon layers 131 and 132, as shown in FIG. 2D.

Next, an etching process, using a ninth mask applied to the insulating layer 160, is performed so as to partially expose the top surface of the collector sink region 21. As shown in FIG. 2E, in the two apertures thus formed, the emitter polysilicon layer 141 and the collector polysilicon layer 122 are respectively formed by depositing an N$^+$ polysilicon layer and patterning the layer using a tenth mask. An oxide layer (not shown) is deposited accompanying the following diffusion process.

In the diffusion process, the implanted P type impurities and the impurities of the P$^+$ base polysilicon layer 131 and the N$^+$ emitter polysilicon layer 141 are diffused into the epitaxial layer 120, thereby forming the base region 130 connected to the base polysilicon layers 131 and 132, and the emitter region 140 connected to the emitter polysilicon layer 141. An eleventh mask is used to pattern the oxide layer, and to reveal the base polysilicon layer 131, the emitter polysilicon layer 141 and the collector polysilicon layer 122.

Then, in a final process not shown, an aluminum layer is deposited and then patterned using a twelfth mask, to thereby form the base electrode, the emitter electrode and the collector electrode, connected to the base polysilicon layer 131, the emitter polysilicon layer 141 and the collector polysilicon layer 122, respectively.

In the conventional fabrication process described above, the boron dopant diffused from the P$^+$ polysilicon forms the base region. However, this brings problems of lithography technique and configuration. That is, it is difficult to reduce a junction area with the conventional method. Another disadvantage is that when forming the base region using the ion implantation process, it is difficult to obtain a base of small width and a sharp slope concentration. In addition, there is some disadvantage in that masks for forming the base polysilicon layer and for performing the base ion implantation are required when forming the elements.

SUMMARY OF THE INVENTION

It is an object of the present invention to solve the above-mentioned problems of the prior art.

Another object is to simplify the process of fabricating the ultrahigh speed bipolar transistor and decrease the collector-base junction capacitance.

Still another object is to reduce the base width and obtain a higher operating speed of the elements.

To achieve these and other objects, the method of producing the bipolar transistor of the present invention includes forming an aperture through a triple layer over an active region of an epitaxial layer, then forming a shallow polysilicon film at the bottom of the aperture. An intrinsic base region is formed by segregating a conductive impurity to the epitaxial layer by thermally oxidizing the polysilicon film. Then an extrinsic base region is formed by diffusing impurities into the epitaxial layer from a polysilicon sidewall formed on the aperture.

In the transistor fabricated according to the present invention, an insulation layer of oxide silicon or nitrogen silicon is formed under the base polysilicon layer. Accordingly, impurities from the base polysilicon layer do not diffuse into the epitaxial layer during the diffusion process. Instead, the extrinsic base region is formed by the diffusion of impurities from the polysilicon sidewall which is connected to the base polysilicon layer. Therefore the length of the entire base region is shortened. Furthermore, by forming the intrinsic base region by thermally oxidizing the shallow polysilicon film, the base width and the transit time are reduced, thus leading to a higher performance speed of the element.

BRIEF DESCRIPTION OF THE DRAWINGS

FIG. 12 is a final schematic view of a bipolar transistor fabricated according to the steps shown in FIGS. 5 to 12.

DETAILED DESCRIPTION OF THE PREFERRED EMBODIMENTS

A preferred embodiment of the present invention is described hereinbelow with reference to the accompanying drawings.

Figure 10:
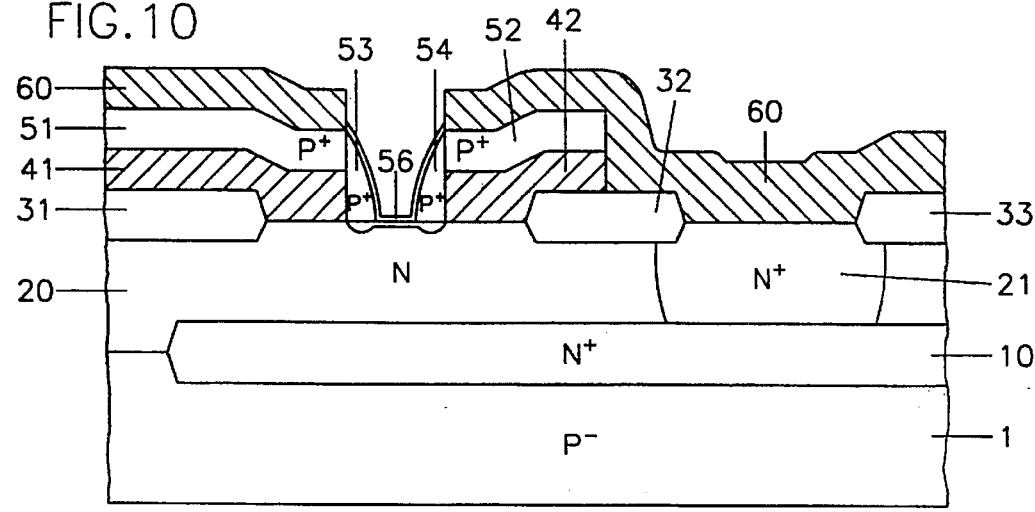
Figure 11:
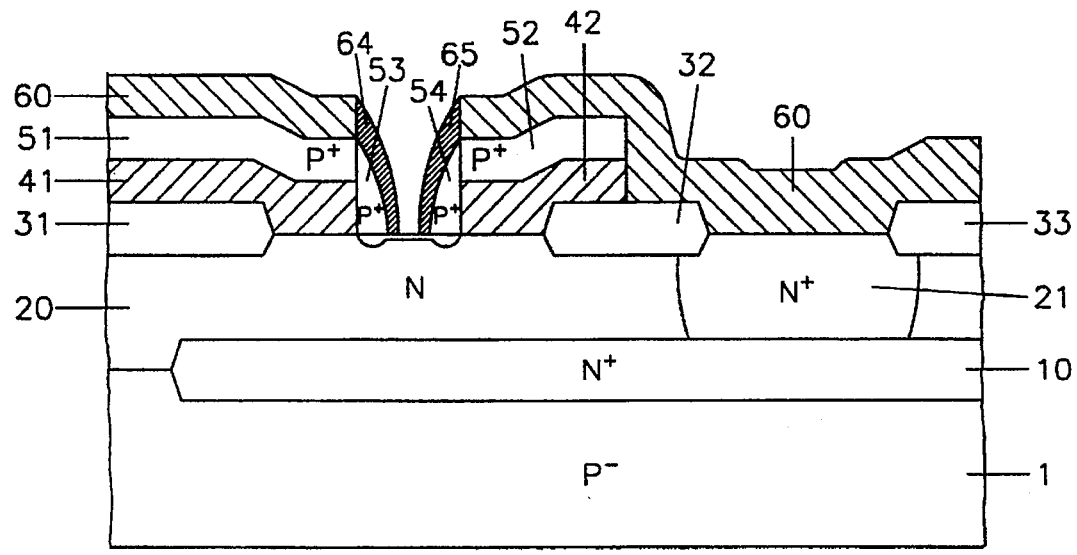
Figure 12:
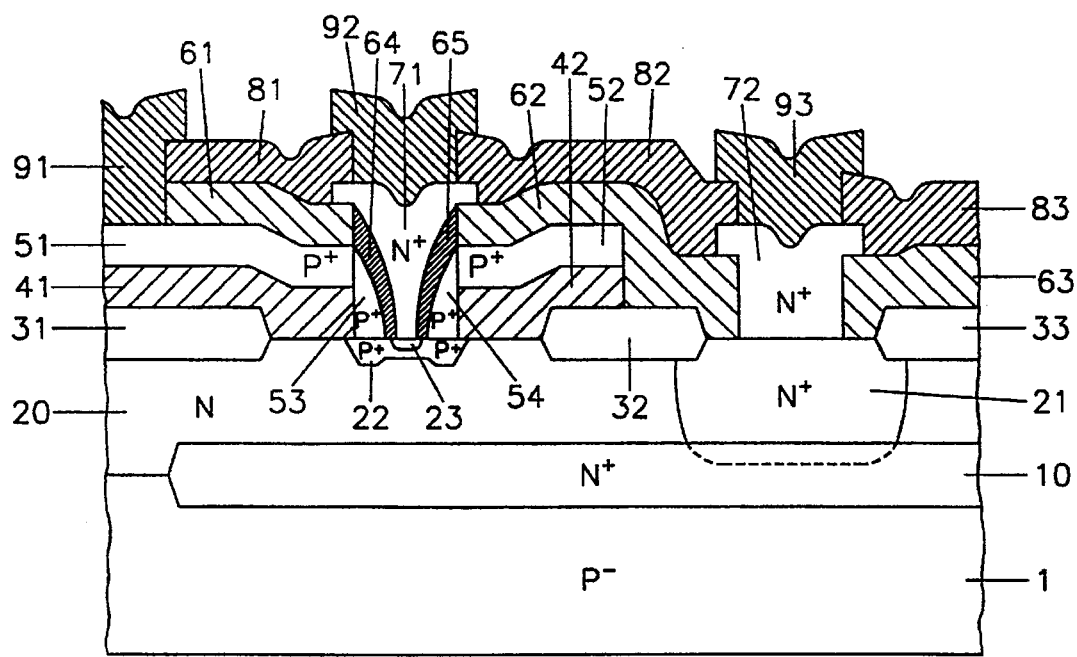

The fabrication steps of an NPN bipolar transistor according to the present invention are shown in FIGS. 5 to 12, in which FIG. 12 is a schematic view of a final transistor resulting from the described fabrication steps. With reference to these figures, the method of producing the bipolar transistor according to the present invention is described below.

Figure 1:
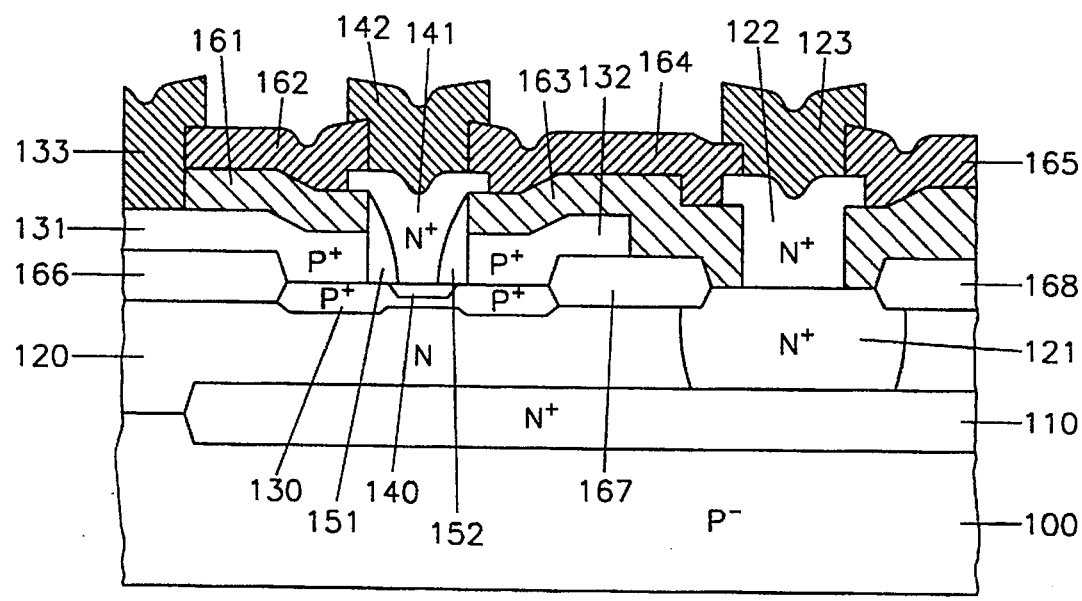
FIG. 1 is a cross-sectional view of a typical prior art vertical bipolar transistor.
Figure 2A:
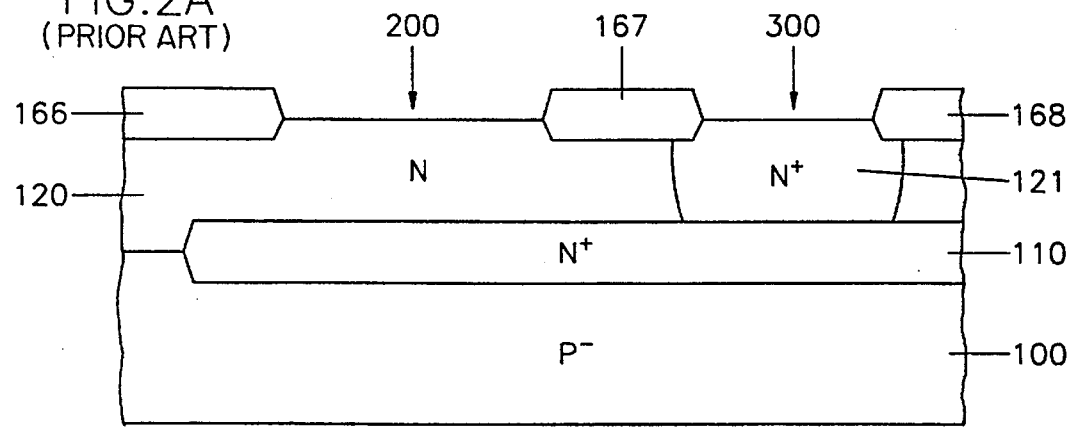
FIGS. 2A to 2E are cross-sectional views showing the successive fabrication processes of the typical prior art vertical bipolar transistor.
Figure 2B:
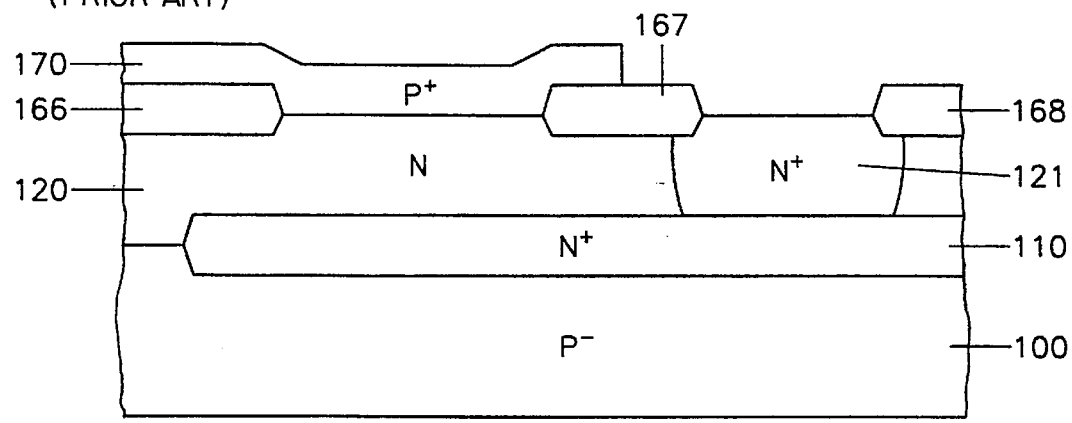
Figure 2C:
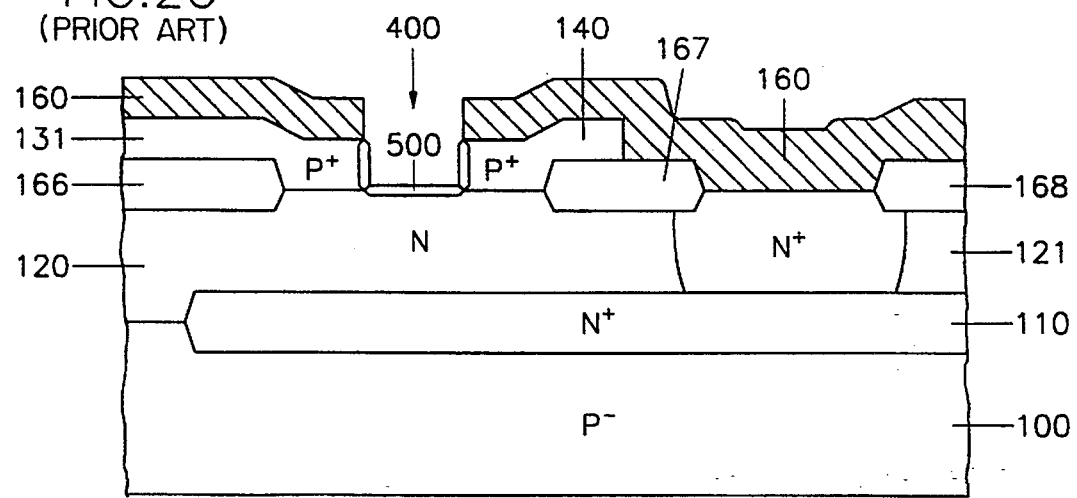
Figure 2D:
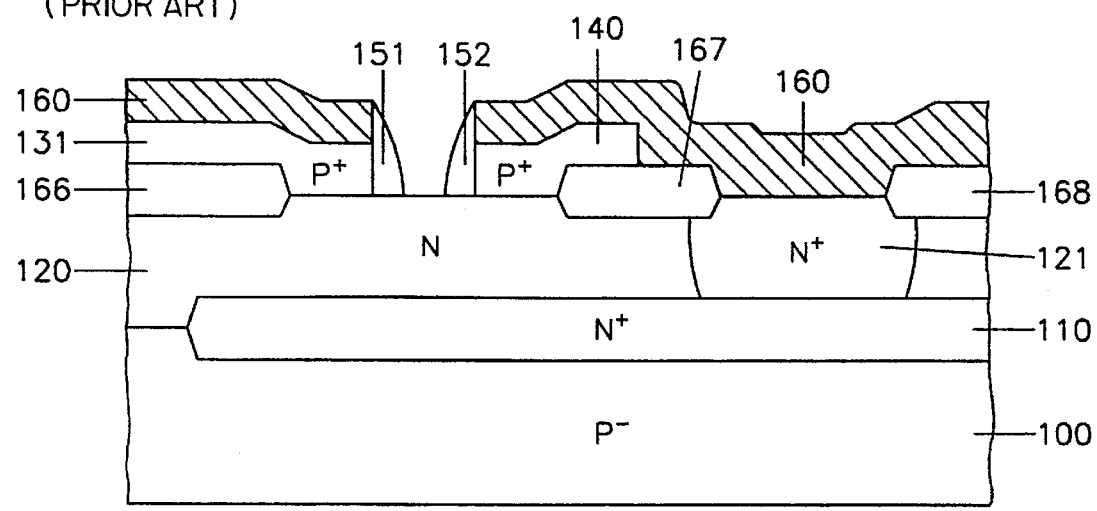
Figure 2E:
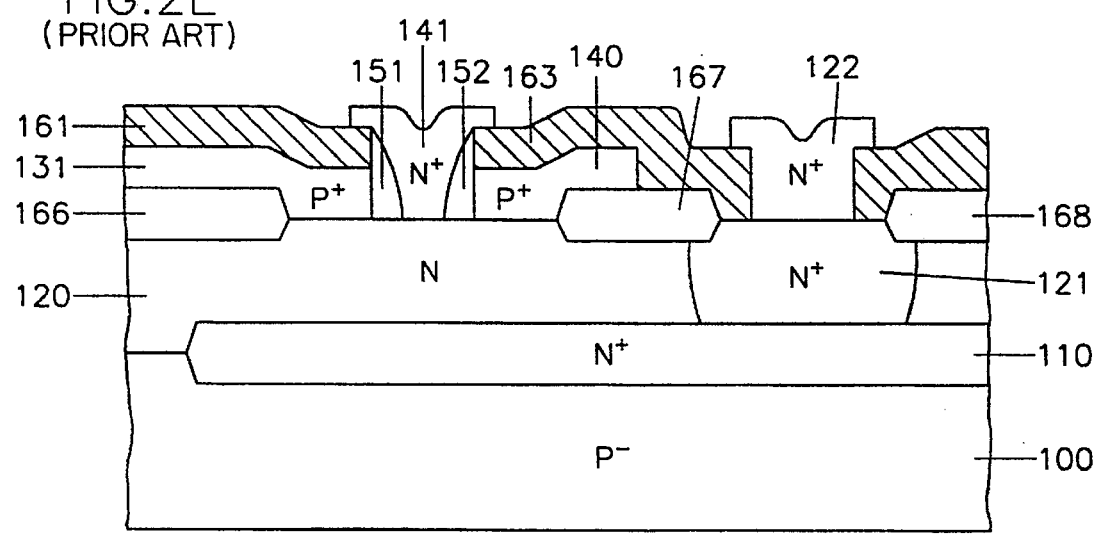
Figure 3:
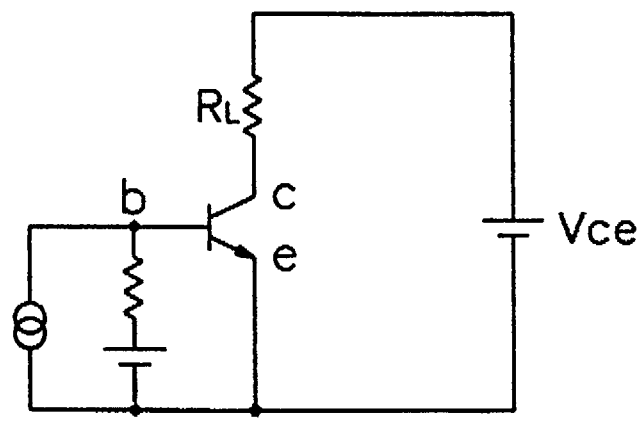
FIG. 3 is a circuit diagram of a common emitter bipolar transistor.
Figure 4:
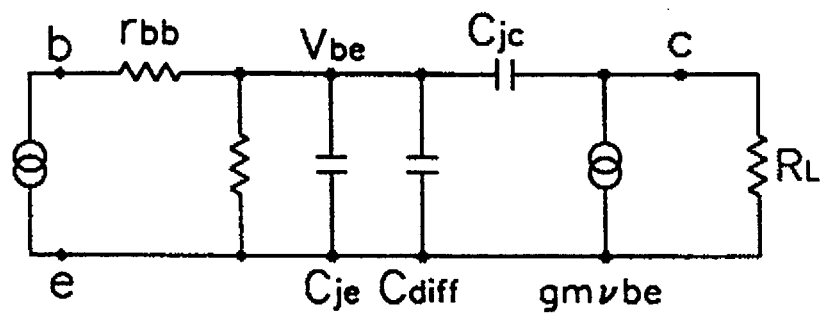
FIG. 4 is a small signal equivalent circuit diagram of a bipolar transistor including a load resistance.
Figure 5:
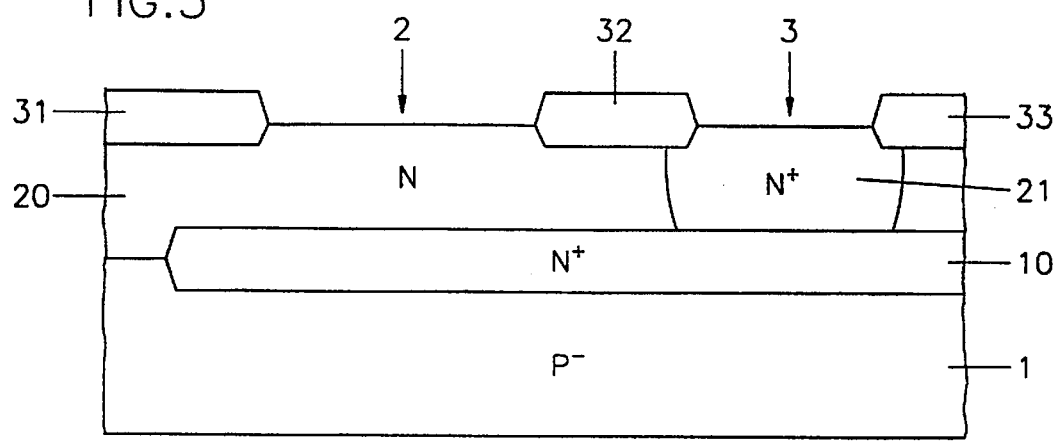
FIGS. 5 to 12 are cross-sectional views showing the successive fabrication processes of a bipolar transistor of the present invention.

As shown in FIG. 5, first, an $N^+$ buried layer 10 is formed on a P type substrate using a first mask. Thereafter, an N type epitaxial layer 20 serving as a collector region is formed on the buried layer 10, and an isolation region for isolating elements (not shown) is formed using a second mask. Successively, an $N^+$ collector sink region 21 is formed in the epitaxial layer 20 using a third mask, and is formed to be connected to the buried layer 10. Next, by means of a LOCOS process, field oxide films 31, 32 and 33 are formed on the epitaxial layer 20 using a fourth mask, and having a predetermined space from one another. The field oxide films 32 and 33 are formed on each end of the $N^+$ collector sink region 21, and the active region 2 is defined between the field oxide film 32 and the field oxide film 31.

Figure 6:
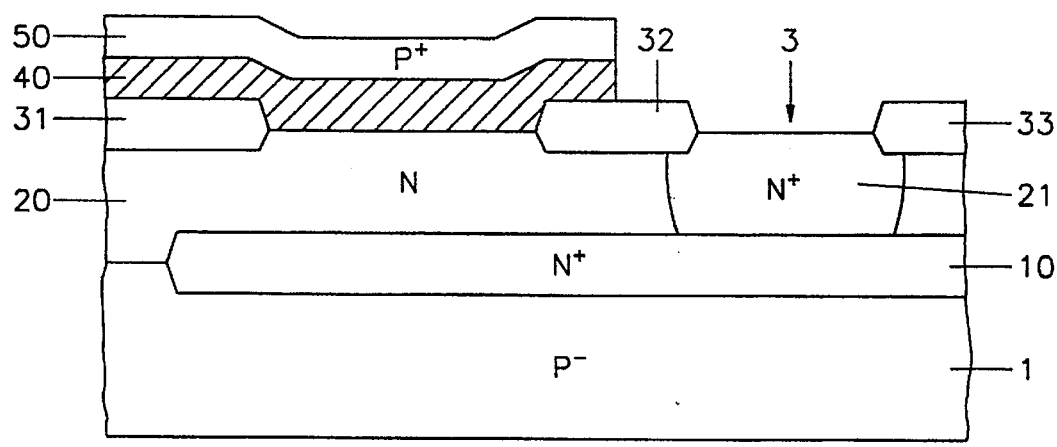

Next, as shown in FIG. 6, insulating material such as $SiO_2$ or $Si_3N_4$, and $P^+$ polysilicon are successively deposited on the epitaxial layer 20, and then patterned using a fifth mask. Accordingly, an insulating layer 40 and a polysilicon layer 50 are formed which cover only the active region 2, and not the collector sink region 21.

Figure 7:
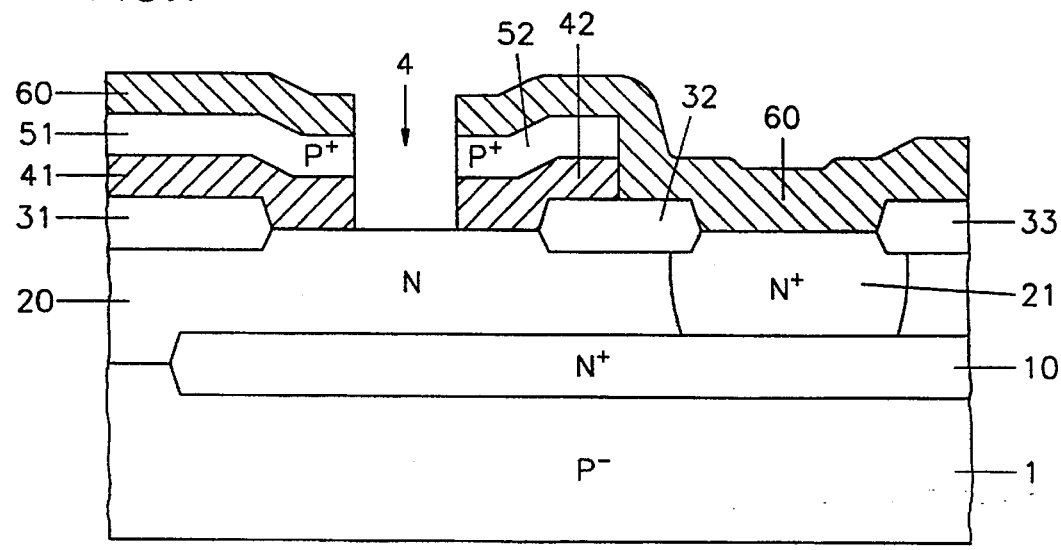

Next, as shown in FIG. 7, insulating material such as $SiO_2$ and $Si_3N_4$ is deposited to form insulating layer 60. Then a sixth mask is used to etch the insulating layers 40 and 60, along with the polysilicon layer 50, to thereby form an aperture 4 in the active region 2. At this time, base polysilicon layers 51 and 52 and the insulating regions 41, 42 from insulating layer 40 and insulating layer 60 become the side surfaces of the aperture 4 in the active area 2.

Figure 8:
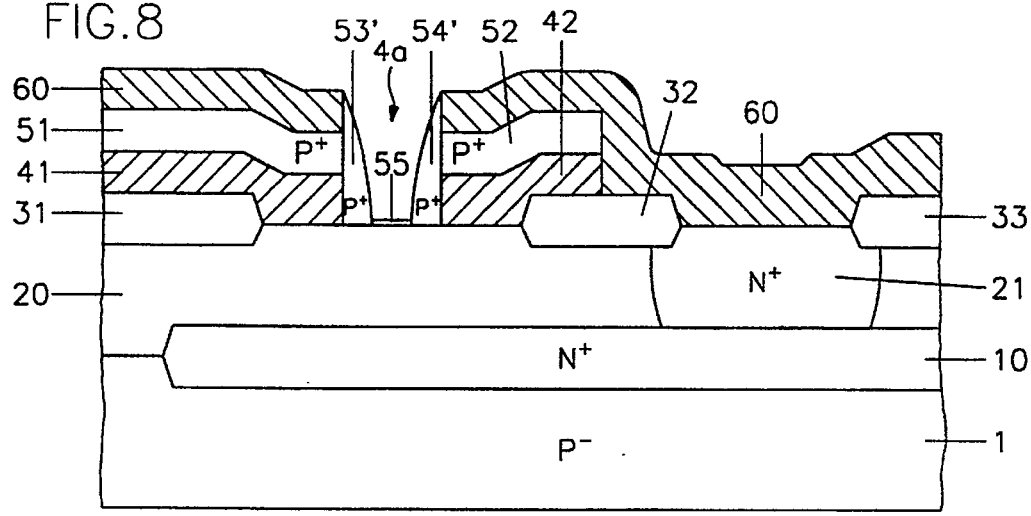

Next, as shown in FIG. 8, the fabrication process continues with the deposition of $P^+$ polysilicon in the aperture. Reactive ion etching is then performed and proceeds until a shallow polysilicon film 55 remains at the bottom of the aperture at the surface of the epitaxial layer, whereby sidewalls 53' and 54' are provided at both sides of the aperture 4a as shown in FIG. 8. Preferably, the shallow polysilicon film 55 has a thickness of 10 to 1000 Å.

Figure 9:
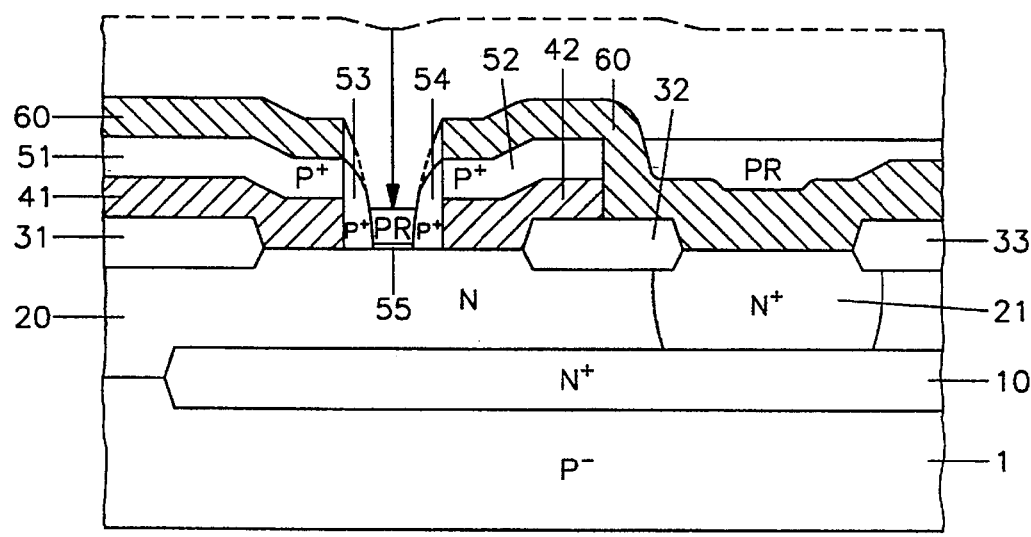

The entire surface is then coated with photoresist, and reactive ion etching is executed with an adjustment of time so that top portions of the sidewalls 53' and 54' adjacent to the insulating layer 60 are exposed, as shown by the broken lines in FIG. 9.

Subsequently, as shown in FIG. 9, an overetch step of the polysilicon sidewalls 53' and 54' is performed. In this overetch step, polysilicon sidewalls 53 and 54 are formed which are connected to the base polysilicon layers 51 and 52. At this time, it is preferable that the final height of the polysilicon sidewalls 53 and 54 should be as high as the base polysilicon layers 51 and 52, and that they are at least electrically connected to the base polysilicon layers 51 and 52, as shown in FIG. 9.

As shown in FIG. 10, the remaining photoresist film PR is then removed, and an oxide layer 56 is formed on the sidewalls 53 and 54 and the shallow polysilicon film 55 using a thermal oxidation. The P type impurity of the sidewalls 53 and 54 diffuses into the epitaxial layer 20 during the thermal oxidation process to begin forming an extrinsic base region. Furthermore, the impurity of the shallow polysilicon film 55 between the sidewalls 53 and 54 is begins formation of an intrinsic base region.

Then, as shown in FIG. 11, insulating material such as $SiO_2$ is deposited, and reactive ion etching is executed to form insulating sidewalls 64 and 65. The insulating sidewalls are formed so as to cover the polysilicon sidewalls 53 and 54, and to prevent the base polysilicon layers 51 and 52 from being exposed. It is preferable that heights of the insulation sidewalls 64 and 65 are equal to that of the insulating layer 60, and the epitaxial layer 20 should be exposed by removing the oxide layer 55 between the insulation sidewalls 64 and 65.

The insulating layer 60 is then etched using an seventh mask to form a collector contact window on the $N^+$ sink region 21. An $N^+$ polysilicon material is then deposited, and a patterning process is executed using a eighth mask so that emitter polysilicon layer 71 is formed on the epitaxial layer 20 between the insulating sidewalls 64 and 65, and a collector polysilicon layer 72 is formed on the $N^+$ sink region of the epitaxial layer 20.

Insulating material is then deposited. Subsequently, impurities of the emitter polysilicon layer 71 and the polysilicon sidewalls 53 and 54 are diffused into the epitaxial layer 20 by a diffusion process. As a result, emitter region 23 and a base region 22 are formed.

Next, the insulating material is etched using a ninth mask to expose the base polysilicon layer 51, the emitter polysilicon layer 71 and the collector polysilicon layer 72 respectively, as shown in FIG. 12. The remaining insulating material forms insulating layers 81, 82 and 83.

Subsequently, a layer of conductive material is deposited and patterned using an tenth mask to form base electrode 91, emitter electrode 92 and collector electrode 93, which are connected to the base polysilicon layer 51, the emitter polysilicon layer 71 and the collector polysilicon layer 72, respectively, as shown in FIG. 12.

In this bipolar transistor, no impurity diffuses into the epitaxial layer from the base polysilicon layer during the diffusion process, because the insulating layer 51 formed of SiO$_2$ or SiN$_x$ is previously formed under the P$^+$ base polysilicon layer. Instead, the extrinsic base region is formed by diffusing impurities from the polysilicon sidewall 53, 54 which is connected to the base polysilicon layer and the epitaxial layer, resulting in a shortening of the length of entire base region and a decrease of the base-collector junction area. In addition, the base width is further reduced because the intrinsic base region is formed by thermally oxidizing the shallow P$^+$ polysilicon film. Accordingly, the base-collector capacitance is reduced, and an operating speed is increased.

Although the present invention has been described above with reference to the preferred embodiments thereof, those skilled in the art will readily appreciate that various substitutions and modifications can be made thereto without departing from the spirit and scope of the invention as set forth in the appended claims.

What is claimed is:

1. A method of producing a bipolar transistor comprising:

forming a triple layer on an epitaxial layer by successively forming a first insulating layer, a base polysilicon layer of a first conductivity type and a second insulating layer, said epitaxial layer being of a second conductivity type and having an active region and a collector region;

opening an aperture through said triple layer to expose a portion of said active region of said epitaxial layer;

forming polysilicon sidewalls of said first conductivity type on exposed portions of said triple layer inside said aperture, said polysilicon sidewalls being connected to portions of said base polysilicon layer exposed in said aperture and portions of said exposed portion of said active region adjacent to said triple layer;

forming a shallow polysilicon film on remaining portions of said exposed portion of said active region of said epitaxial layer between said polysilicon sidewalls;

forming an intrinsic base region by segregating an impurity of said first conductivity type to said epitaxial layer by thermally oxidizing said shallow polysilicon film;

forming insulating sidewalls over said polysilicon sidewalls and said portions of said base polysilicon layer exposed in said aperture;

forming an emitter polysilicon layer of said second conductivity type connected to said remaining portions of said exposed portion of said active region of said epitaxial layer;

forming a collector polysilicon layer of said second conductivity type on said collector region of said epitaxial layer, said collector polysilicon layer being insulated from said emitter polysilicon layer; and forming an emitter region and a base region in said active region of said epitaxial layer by simultaneously diffusing impurities of said emitter polysilicon layer and impurities of said polysilicon sidewalls into said epitaxial layer.

2. A method of claim 1 wherein said step of forming said polysilicon sidewalls includes adjusting their height so that tops of said polysilicon sidewalls are adjacent to an upper surface of said base polysilicon layer.

3. A method of claim 1 wherein said step of forming said insulating sidewalls includes adjusting their height so that tops of said insulating sidewalls are adjacent to an upper surface of said second insulating layer.

4. A method of claim 1 wherein said first conductivity type is defined as P type and said second conductivity type is defined as N type.

5. A method of claim 1 wherein said shallow polysilicon film is formed having a thickness in the range of 10 to 1000 Å.

6. A method of claim 1 wherein said step of forming said polysilicon sidewalls includes:

depositing polysilicon of said first conductivity type in said aperture;

etching said polysilicon by a reactive ion etching to expose said remaining portions of said exposed portion of said active region of said epitaxial layer, and to form said polysilicon sidewalls on sides of said aperture;

coating said aperture with a photoresist film and etching by a reactive ion etching to expose tops of said polysilicon sidewalls;

overetching said polysilicon sidewalls to adjust their height so that said tops of said polysilicon sidewalls are adjacent to an upper surface of said base polysilicon layer; and removing remaining portions of said photoresist film.

7. A method of claim 1, further comprising:

forming an extrinsic base region by simultaneously thermally oxidizing said polysilicon sidewalls while thermally oxidizing said shallow polysilicon film.

* * * * *